(12) United States Patent
Roessler et al.

(10) Patent No.: US 6,403,945 B2
(45) Date of Patent: *Jun. 11, 2002

(54) DEVICE AND METHOD FOR DETECTING AND DISTINGUISHING SHELF-FORMING SUPPORTS IN CASSETTES AND DISK-SHAPED OBJECTS DEPOSITED THEREON

(75) Inventors: Manfred Roessler, Kahla; Peter Vorberg, Jena, both of (DE)

(73) Assignee: Brooks Automation GmbH, Chelena (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/184,562

(22) Filed: Nov. 2, 1998

(30) Foreign Application Priority Data

Nov. 27, 1997 (DE) .......................... 197 52 510

(51) Int. Cl.⁷ ................................ G06M 7/00
(52) U.S. Cl. ............. 250/221; 250/559.36; 414/331.15
(58) Field of Search ............... 250/221, 559.4, 250/559.29, 559.3, 559.32, 559.33, 559.36, 559.12, 223 R; 356/388, 398, 400; 414/936, 937, 934, 331.15, 416, 217

(56) References Cited

U.S. PATENT DOCUMENTS 5,387,067 A * 2/1995 Grunes ..................... 414/217
5,605,428 A * 2/1997 Birkner et al. ......... 414/331.15

FOREIGN PATENT DOCUMENTS

| DE | 19535871 | 2/2000 |
| WO | WO9220995 | 11/1992 |
| WO | WO 94/20979 | * 9/1994 |

* cited by examiner

Primary Examiner—Que T. Le
Assistant Examiner—Thanh X Luu
(74) Attorney, Agent, or Firm—Perman & Green, LLP

(57) ABSTRACT

A device and a method for detecting and distinguishing between shelf-forming supports in cassettes and disk-shaped objects deposited thereon are provided for increasing accuracy in the determination of the position of shelves and objects as well as reliability of detection in distinguishing between cassette types without a disruptive influence being exerted on the objects by the inserted protective supports. The objects and different types of supports for the objects which are distinguished through an offset arrangement in the measurement plane pass through measurement beam bundles with their end sides, wherein each of the measurement beam bundles is situated in the region of only one type of support. The extension of the end sides of the supports in the measurement plane is completely detected by the measurement beam bundle. The device is used for the fabrication of integrated circuits.

8 Claims, 5 Drawing Sheets

DEVICE AND METHOD FOR DETECTING AND DISTINGUISHING SHELF-FORMING SUPPORTS IN CASSETTES AND DISK-SHAPED OBJECTS DEPOSITED THEREON

BACKGROUND OF THE INVENTION a) Field of the Invention

The invention relates to the detection and distinguishing of shelf-forming supports in cassettes and disk-shaped objects deposited thereon by displacement of the supports and objects together relative to a measurement plane in the direction of shelves that are located one above the other, wherein end sides of the supports and objects successively pass through bundles of measurement beams, wherein different types of supports are distinguished from one another by an offset arrangement in the measurement plane vertically to the measurement beam bundles.

b) Description of the Related Art

Technical solutions of the kind mentioned above are applicable in the fabrication of integrated circuits, especially for handling tasks, and are known, for example, from DE 195 35 871 A1.

In the fabrication of integrated circuits, disk-shaped objects such as templates or masks and semiconductor wafers must be transported between different machining steps to individual machining devices. For this purpose, the objects are accommodated in cassettes which, because of cleanroom requirements, are usually enclosed by transport containers. In order to charge the machining devices, the cassettes are unloaded from the transport containers by suitable means and the disk-shaped objects are removed and put back again by a handling device. For this purpose, it is necessary to detect the position of a shelf on which the object is deposited as well as the occupation of a shelf by an object.

Known detection systems are basically distinguished according to two different types. In a first method (mapping), the geometric dimensions of the cassette, especially the distance between shelves, are assumed to be known. If the position of a shelf is aligned with respect to a reference plane of the handling system, the positions of all of the other shelves can be determined and approached by computation. A light barrier determines if a shelf is occupied.

A second method (indexing) includes in the detection possible dimensional deviations of the cassettes due to manufacturing tolerances or deformations. The position of the shelves and objects with respect to a reference plane is exactly determined by means of a sensor system.

It is known from DE 195 35 871 A1, to distinguish types of mask cassettes with a reflection coupler at the same time that shelves and objects are detected. Since the light beam of the reflection coupler strikes either the mask support (6" cassette) or the crosspiece (5" cassette), there are differences in the duration of the high level during the movement of the cassette in the vertical direction. With respect to the 6" cassette, the position of the mask support relative to a reference plane can be determined by a combination of path measurement and determination of the time of the high-low transition of the reflection coupler. In the case of a 5" cassette, it is necessary that the difference in height between the mask support and the crosspiece is included in the calculation. The presence of objects is detected by positioning a light beam bundle of a light barrier diagonally through the cassette.

It is disadvantageous that dimensional differences usually occurring in the cassettes result in an unrecoverable falsification of the determination of position and in a reduced reliability of detection in distinguishing between types of cassettes.

OBJECT AND SUMMARY OF THE INVENTION

Therefore, it is the primary object of the invention to increase accuracy in the determination of the position of shelves and objects as well as the reliability of detection in distinguishing between cassette types without a disruptive influence being exerted on the objects by the inserted protective supports.

According to the invention, this object is met by a device for detecting and distinguishing between shelf-forming supports in cassettes and disk-shaped objects deposited thereon by displacement of supports and objects together relative to a measurement plane in the direction of shelves located one above the other, in which end sides of the supports and objects successively pass through bundles of measurement beams, wherein different types of supports are distinguished from one another by an offset arrangement in the measurement plane vertical to the measurement beam bundles. Each of the measurement beam bundles is situated in the region of only one type of support, wherein the extension of the end sides of the supports in the measurement plane is completely detected by the measurement beam bundles.

It is especially advantageous when the measurement beam bundles have a substantially rectangular cross section whose extension in the measurement plane at least corresponds to that of the end sides of the supports and, vertical to the measurement plane, is smaller than the thickness of the objects.

Due to the fact that the measurement beam bundle extends to a sufficient degree in the measurement plane vertical to the beam direction, the light beam detects even a small deviation in position and differences in size of the supports in this direction. The limiting of the vertical dimension of the light beam ensures steep edges of the measurement signal during the passage of the cassette and ensures that the position of the supports and objects are accurately determined. Single-cassettes and multi-cassettes are distinguished by detecting the number of supports and objects.

In a first variant, the measurement beam bundles are directed parallel to one another, are arranged in the region of a wall of the cassette and are at a distance from one another corresponding to the degree of offset.

In a second variant, at least one of the measurement beam bundles is arranged in the region of a wall serving as a carrier for each of the supports, wherein these measurement beam bundles are directed parallel to one another.

The measurement beam bundles are advantageously arranged as laser light barriers whose radiation sources and receivers are accommodated in a frame through which the cassette passes in a vertical movement so as to be aligned with the frame.

A pair of columns serves as a carrier for the frame, wherein the columns are arranged at a distance from one another so as to form an air passage, wherein a drive for an elevator for the vertical movement of the cassette is accommodated in a column.

A further object of the invention is a method for detecting and distinguishing between shelf-forming supports in cassettes and disk-shaped objects deposited thereon. The method is based on the evaluation of signals which are formed by an interruption of measurement beam bundles resulting from displacement of the supports and objects together relative to a measurement plane in the direction of shelves located one above the other, in which end sides of the supports and objects successively pass through measurement beam bundles, wherein different types of supports can be distinguished through an offset arrangement in the measurement plane vertical to the measurement beam bundles. The signals of all of the measurement beam bundles, each of which is situated in the region of only one type of support and completely detects the extension of the end sides of the supports in the measurement plane, are evaluated simultaneously and in correlation with one another.

The invention will be explained more fully hereinafter with reference to the schematic drawing.

DESCRIPTION OF THE PREFERRED EMBODIMENTS

Figure 1:
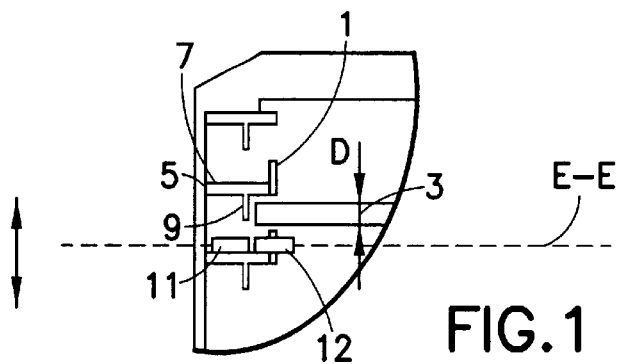
FIG. 1 is a rear view of a section from a 5" cassette with an arrangement of measurement beam bundles in the region of a cassette wall.

The illustrated sections show only part of the cassette walls 5, 6 of a 5" cassette (FIG. 1) and a 6" cassette (FIG. 2) which contain, at opposite walls, shelf-forming supports 1, 2 for disk-shaped objects in the form of masks 3, 4. In order to fasten them to the cassette walls 5, 6, the supports 1, 2 are constructed as elements which are bent in an L-shaped manner arranged at one end of a crosspiece 7, 8. Lateral stops 9, 10 prevent the objects from sliding. Two measurement beam bundles 11, 12 of laser light barriers which are directed parallel to one another and are arranged in a measurement plane E—E and in the region of a cassette wall 5, 6 can be seen in rectangular cross section and pass through each of the cassettes for detecting the supports 1, 2 and the objects. With respect to their extension in the measurement plane E—E, the cross sections correspond at least to those of the end sides of the supports 1, 2. In every case, they are sufficiently large that a lateral deviation in position of the supports 1, 2 due to tolerances in the manufacture of the cassettes ensures complete detection of the supports 1, 2. Vertical to the measurement plane E—E, the cross sections of the measurement beam bundles 11, 12 are smaller than the thickness D of the objects. As will be clear from FIGS. 1 and 2, the supports 1, 2 of different-sized cassettes in a centered arrangement can be distinguished by a lateral offset which is directed vertical to the measurement beam bundles 11, 12 in the measurement plane E—E.

Since the spacing of the two measurement beam bundles 11, 12 essentially corresponds to the lateral offset of the supports 1, 2, each measurement beam bundle 11, 12 covers only one of the types of supports that are differentiated by the offset.

Of course, distinguishing between the cassette types is not limited to the 5" and 6" cassettes described herein. Cassettes of different sizes can be used and the quantity of these cassettes can also be increased. Increasing the number of cassettes to be detected only requires a corresponding expansion or widening of the measurement beam bundles which are to be arranged again so as to be displaced relative to one another to the extent of offset between the supports.

Figure 2:
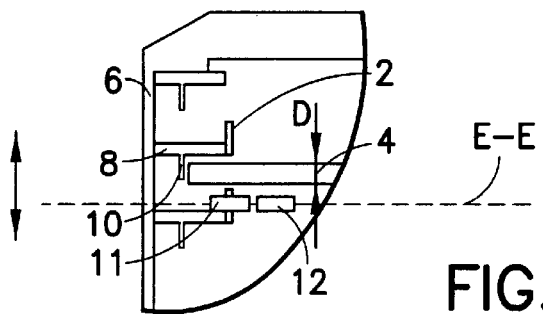
FIG. 2 is a rear view of a section from a 6" cassette with an arrangement of measurement beam bundles in the region of a cassette wall.
Figure 3:
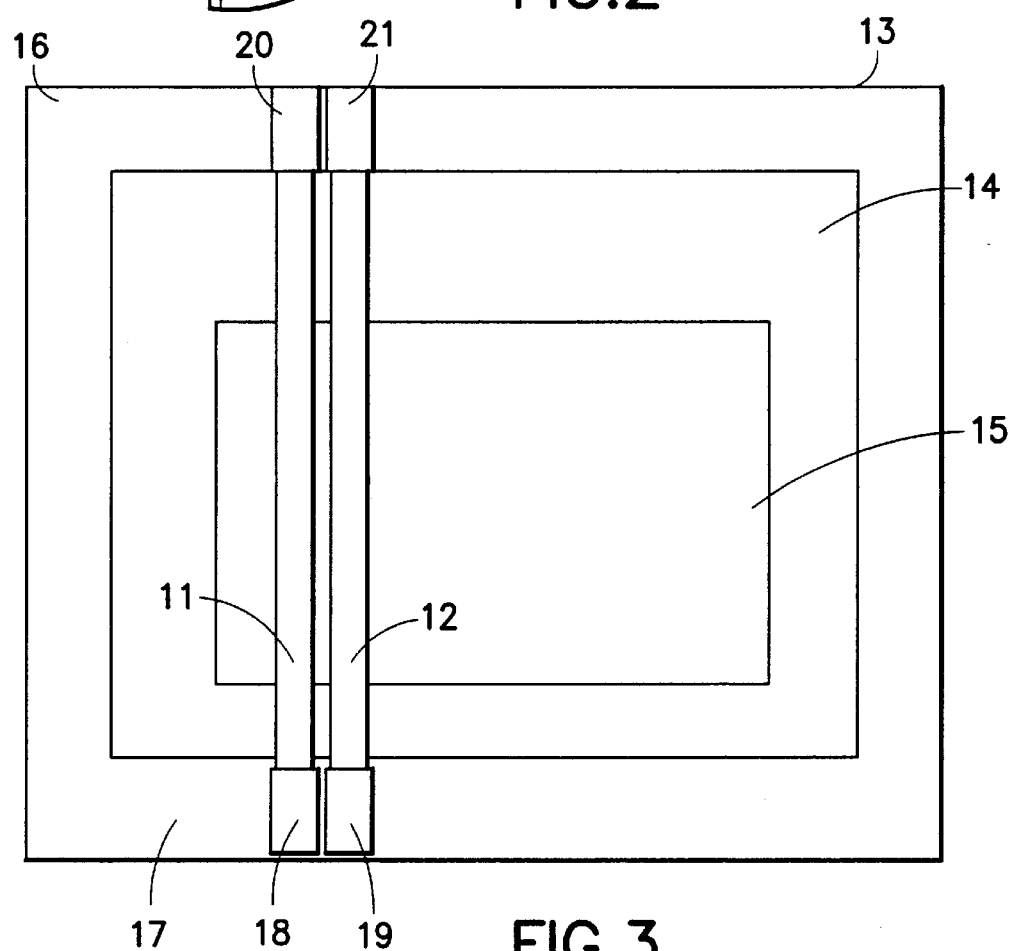
FIG. 3 is a top view of a cassette with an arrangement of measurement beam bundles.

In FIG. 3, whose elements, shown in a very simplified manner, are likewise aligned with those of FIGS. 1 and 2, a frame 13 encloses a space 14 in which a cassette 15, in this case the 6" cassette shown in FIG. 2, is displaceable in a vertical movement through the frame 13 and accordingly through the measurement beam bundles 11, 12. Each of the frame parts 16, 17 which are located opposite one another carries radiation elements 18, 19 and receivers 20, 21 for the measurement beam bundles 11, 12.

Figure 4:
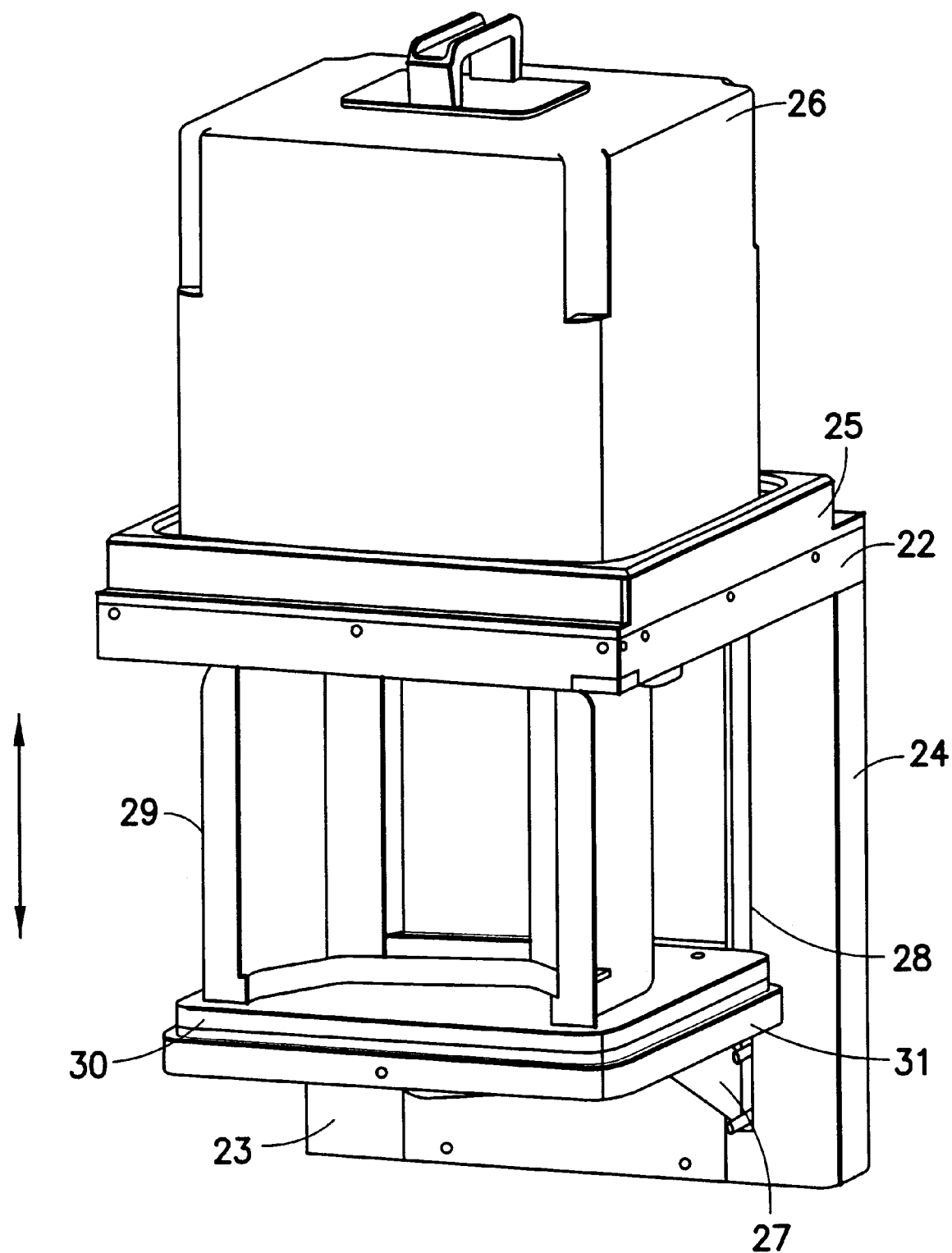
FIG. 4 is a perspective view of a cassette indexer with lowered cassette.

In FIG. 4, a frame 22 for receiving the radiation and reception elements for the measurement beam bundles 11, 12 is integrated in a cassette indexer. A supporting column 23 and a column-shaped panel 24 of an elevator drive are arranged at a distance from one another to form an air passage and serve as carriers for the frame 22 and a receiving plate 25 which is located above the latter and on which the cassette container 26 can be deposited. A receiving arm 27 which is movable vertically by means of the elevator drive 24 and which projects out of the panel 24 through a slit-shaped opening 28 is provided in order to remove and restore a cassette 29 located in the cassette container 26.

The elevator drive comprises a spindle which is driven by a stepper motor. A spindle nut coupled with the receiving arm 27 runs on the spindle in a guide that is fixed with respect to the frame. The step number of the motor, and accordingly the distance traveled, is determined by an encoder. The indexer is connected to external control electronics via a cable connection, not shown.

Removal, during which the cassette 29 is guided through the frame 22, is carried out in that the unlocked bottom 30 of the cassette container 26 is lowered together with the cassette 29 and a closure element 31 in the receiving plate 25. The defined cassette orientation necessary for the detection of different cassette types is ensured in that the cassette 29 is initially aligned with the bottom 30 and the latter fits, by way of suitable recesses, on pins 32, 33, 34 (FIG. 5) on the closure element 31.

Figure 5:
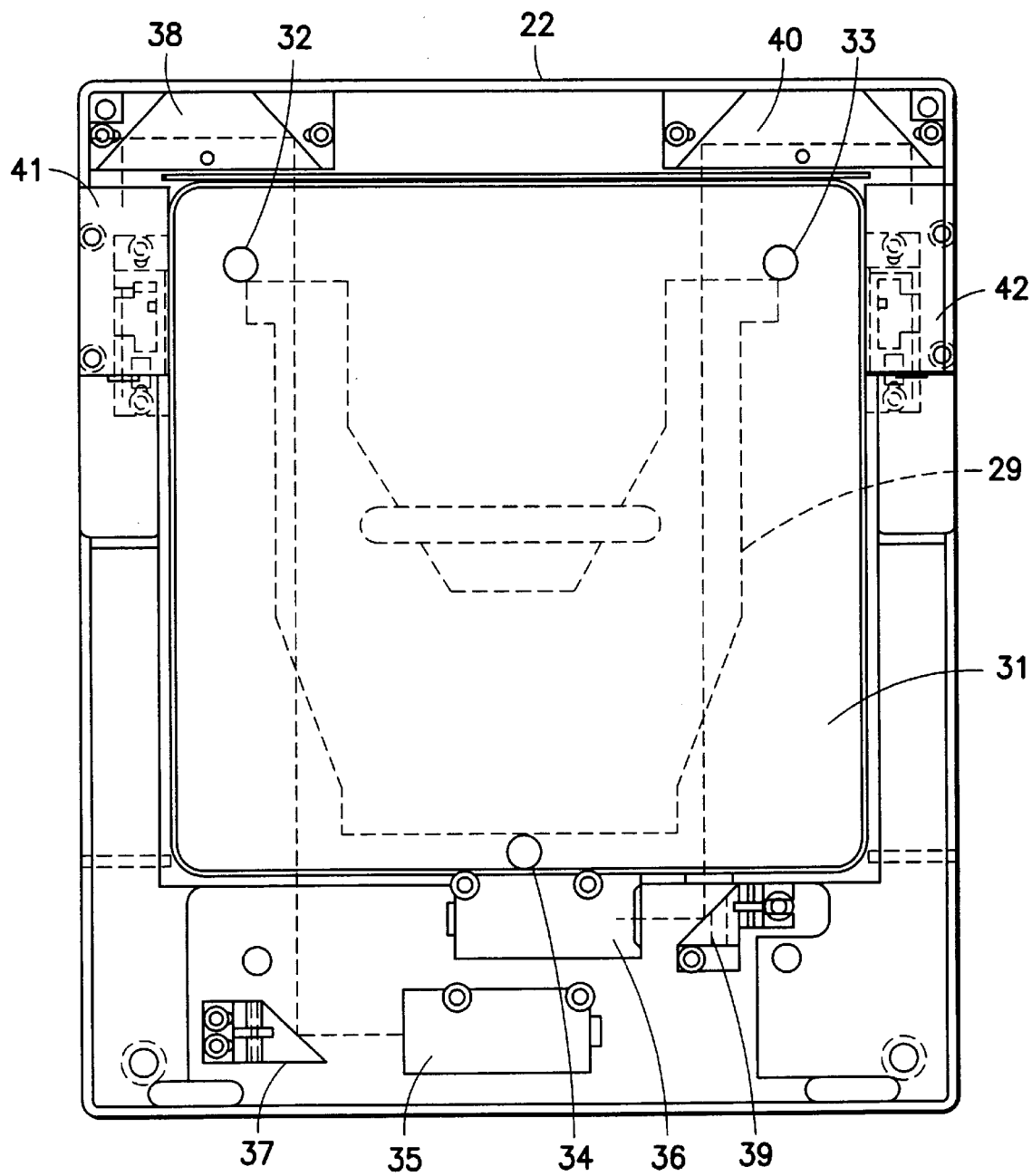
FIG. 5 is a top view of a frame for holding radiation elements, receivers and deflecting devices for the measurement beam bundles.

According to FIG. 5, the frame 22 carries radiation elements 35, 36 for generating the measurement beam bundles 11, 12. In order to make use of the limited available space, deflecting elements 37, 38, 39, 40 are provided which direct the measurement beam bundles 11, 12 to receivers 41, 42. In FIG. 5, in contrast to FIG. 3 in which the measurement beam bundles 11, 12 are both situated in the region of a cassette wall, measurement beam bundle 11 is arranged in the region of one cassette wall and measurement beam bundle 12 is arranged in the region of the opposite cassette wall. Within their area of arrangement, the measurement beam bundles 11, 12 are displaced relative to one another substantially by the distance of the lateral offset of the supports 1, 2, so that measurement beam bundle 11 strikes the supports 2 of the 6" cassette and measurement beam bundle 12 strikes the supports 1 of the 5" cassettes.

Figure 6:
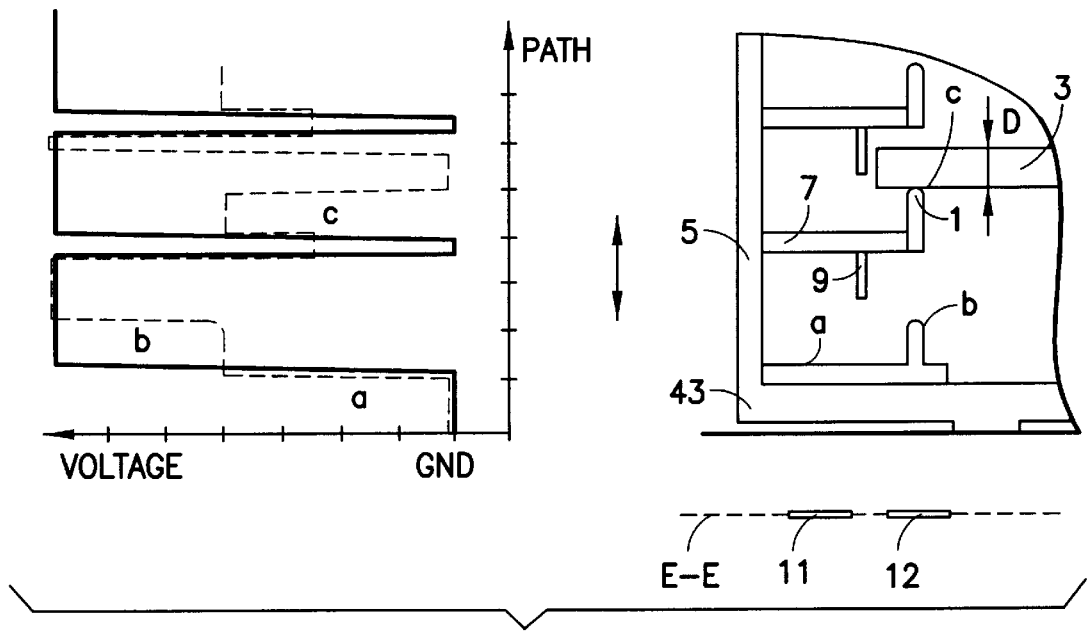
FIG. 6 shows the signal waveform during the scanning of a 5" cassette with two parallel measurement beam bundles.
Figure 7:
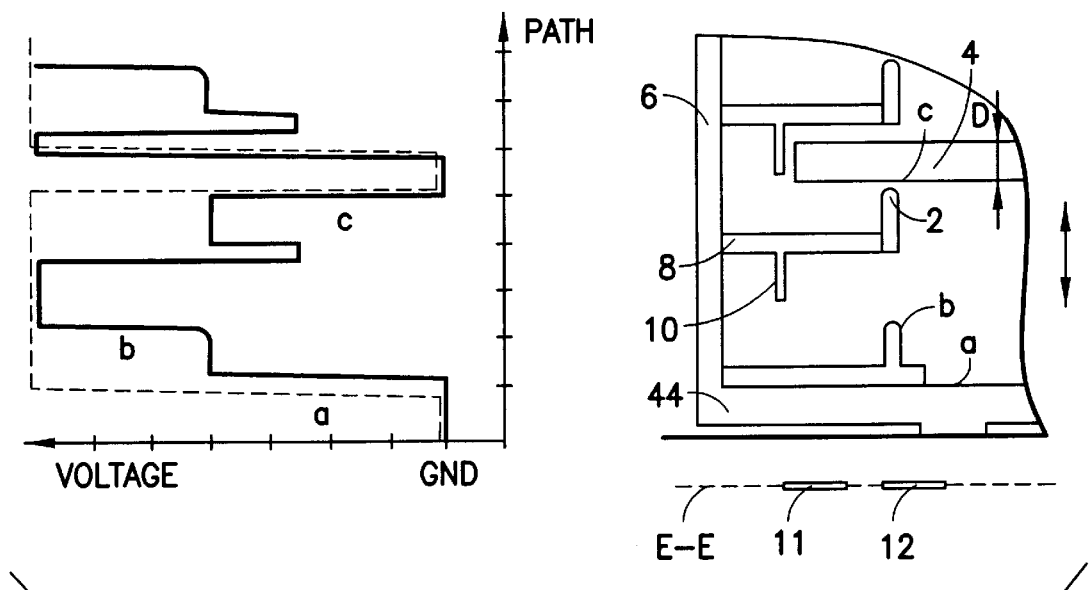
FIG. 7 shows the signal waveform during the scanning of a 6" cassette with two parallel measurement beam bundles.

The signal waveforms shown in FIGS. 6 and 7 occur when a cassette with its supports and objects deposited thereon is guided vertically through the measurement beam bundles 11, 12 during an indexing process. In the present case, an object is inserted in only one shelf of the cassette in order to illustrate the detection process. The signal waveforms contain, as a function of the traveled distance (step number of the stepper motor for driving the elevator), the necessary distinguishing features for detecting the relevant elements whose positions are accordingly determined with respect to a reference plane. Since the supports in a 5" cassette are displaced toward the center of the space enclosed by the frame 13 or 22 in comparison to larger cassettes due to the smaller dimensions, the supports 1 and the objects are covered only by measurement beam bundle 12. Measurement beam bundle 11 strikes the crosspiece 7. In the case of 6" cassettes, the supports 2 pass through measurement beam bundle 11 and the objects pass through measurement beam bundle 12. During a vertical downward movement, in both types of cassette, the bottoms 43, 44 of the cassettes first move through measurement beam bundles 11, 12, so that both measurement beam bundles 11, 12 are completely interrupted. After both measurement beam bundles 11, 12 in the 5" cassette have reached area a, measurement beam bundle 11 is received in its entirety by its receiver 41, so that the signal which is converted to a voltage reaches its maximum. A first support 1 passes through measurement beam bundle 12, so that, although there is a rise in the signal, the signal maximum is not yet reached initially. Its level is not at a maximum again until position b. Measurement beam bundle 11 is then completely interrupted by the second crosspiece 7, whereas measurement beam bundle 12 is only partially interrupted. Subsequently, the second support 1 moves through the measurement beam bundle 12. The measured level corresponds to that with respect to the first support before the object reduces the measured signal to the base level GND at position c.

The 6" cassette can be distinguished from the smaller 5" cassette by the different signal waveform. In the case of the 6" cassette, the signal pertaining to measurement beam bundle 12 first reaches its maximum. At position b, it is the signal of measurement beam bundle 11 that reaches its maximum proceeding from a medium level. A 6" object allows both signals to drop to the base level, whereas a 5" object only allows the signal of measurement beam bundle 12 to drop to base level. In the case of the 6" cassette, the crosspieces 8 only influence the signal of measurement beam bundle 11, whereas both signals are influenced in the case of the 5" cassette. Even if the evaluation of one of the signals already allows them to be distinguished, a parallel evaluation of both signals can prevent erroneous detection due to unfavorable geometric conditions with each type of cassette.

Figure 8:
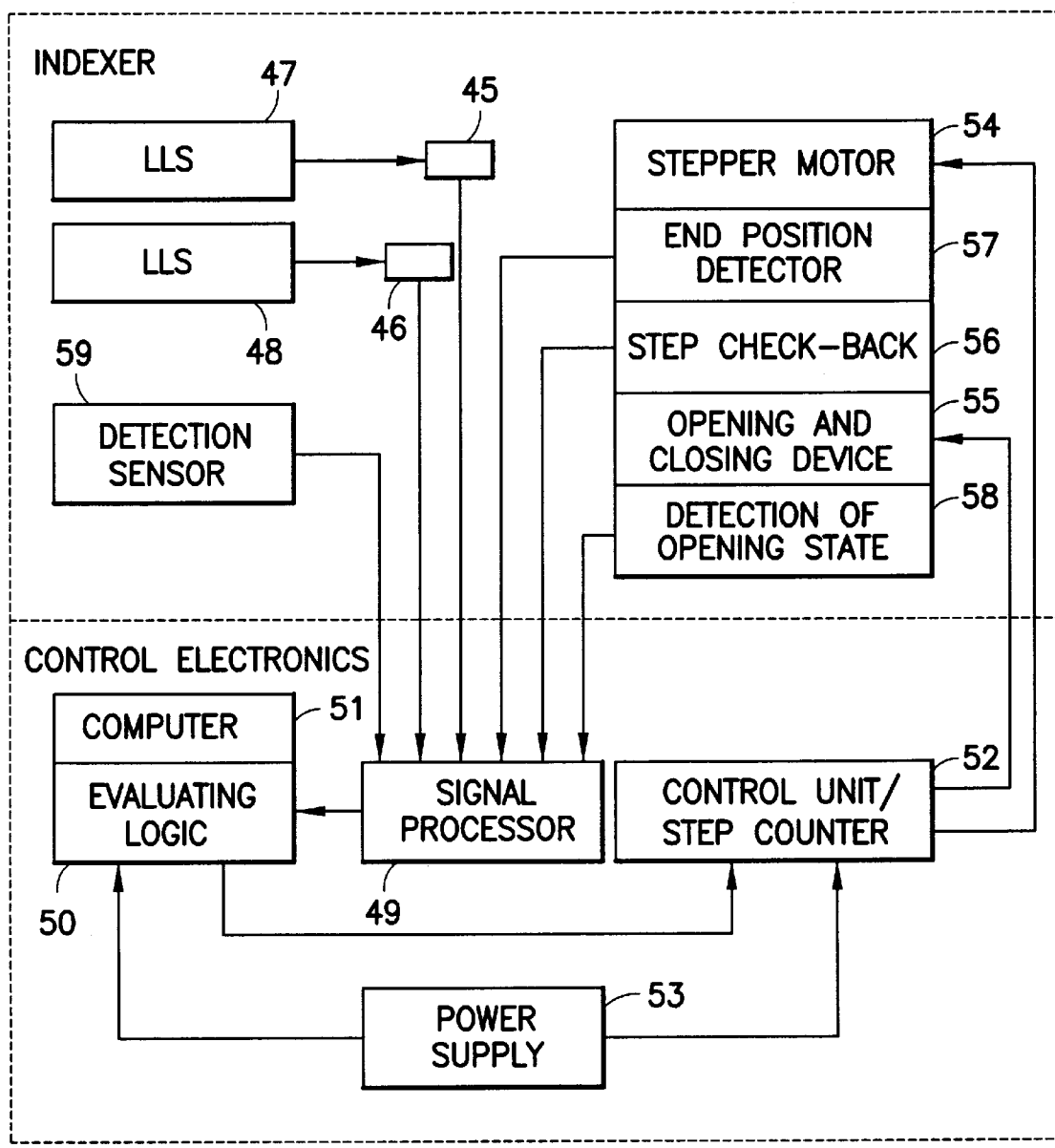
FIG. 8 shows a block wiring diagram of the indexer.

In a wiring diagram shown in FIG. 8 which is divided between the indexer and its control electronics, signals of the laser light barriers, designated by 47 and 48, that are digitized by A/D converters 45, 46 are supplied to a signal processor 49 which communicates with evaluating logic 50 of a computer 51. By means of a control unit and step counter 52 which, like the computer 51, is connected to a power supply 53, signals obtained by means of the evaluating logic 50 are supplied as control signals to a stepper motor 54 for adjusting the elevator and to a device 55 for opening and closing the cassette container 26. Signals are sent as reports to the signal processor 49 from a step check-back unit 56, an end position detector 57, means for detecting the opening state 58 of the cassette container 26 and from further sensors 59 which, e.g., signalize the placement of the cassette container 26.

While the foregoing description and drawings represent the preferred embodiments of the present invention, it will be obvious to those skilled in the art that various changes and modifications may be made therein without departing from the true spirit and scope of the present invention.

What is claimed is:

1. In a device for detecting shelf-forming supports in cassettes and disk-shaped objects deposited thereon and distinguishing between different types of the cassettes by displacement of the supports and the objects together relative to a measurement plane in a vertical direction, in which the supports and objects successively pass through measurement beams of bundles, the device having at least one sensor for detecting the measurement beams, wherein the supports or the different types of the cassettes are distinguished from one another by an offset arrangement of the supports in the measurement plane an improvement comprising:

each of the measurement beams being situated in a region of end sides of only one type of the supports; and
   wherein the measurement beams are located relative to the end sides of the different types of supports in the measurement plane such that the end sides are completely detected by respective ones of the measurement beams and the at least one sensor.

2. The device according to claim 1, wherein one measurement beams comprise beam bundles which have a substantially rectangular cross section whose length in the measurement plane is at least as long as a length of the end sides of the respective supports and, vertical to the measurement plane, is smaller than the thickness of the objects.

3. The device according to claim 2, wherein the measurement beam bundles are directed parallel to one another, are arranged in a region of a wall of the cassette and are at a distance from one another corresponding to the offset.

4. The device according to claim 2, wherein at least one of the measurement beam bundles is arranged in a region of a wall serving as a carrier for each of the supports, wherein the measurement beam bundles are directed parallel to one another.

5. The device according to claim 3, wherein the measurement beam bundles are arranged as laser light barriers whose radiation sources are accommodated in a frame through which the cassette passes in a vertical movement so as to be aligned with the frame.

6. The device according to claim 5, wherein a pair of columns serves as a carrier for the frame, wherein the columns are arranged at a distance from one another so as to form an air passage, wherein a drive for an elevator for the vertical movement of the cassette is accommodated in a column.

7. A method for determining a type of object supporting cassette from a plurality of possible different types of cassettes, the cassettes each comprising a different array of supports, the method comprising the steps of:

displacing the support array of supports of one of the cassettes in a vertical direction along a support path;
   providing a first beam path of a first measurement beam and detecting end sides of the displaced supports, when the displaced supports are from a first type of the cassettes, as the end sides are moved in the support path and through the first beam path;
   providing a second beam path of a second measurement beam, at least partially offset from the first beam path in a horizontal direction, and detecting end sides of the displaced supports, when the displaced supports are from a second type of the cassettes, as the end sides pass through the second beam path; and detecting the first and second beams by at least one sensor as the support array of supports is moved along the support path.

8. A cassette detector for distinguishing between different types of cassettes adapted to support planar objects, each cassette having a different array of object supports, the detector comprising:
- a first energy emitter;
- a second energy emitter; and
- at least one sensor for sensing energy emitted from the first and second emitters,
- wherein the first emitter has a first energy path adapted to be periodically at least partially blocked by end sides of the object supports of a first type of the cassettes when the object supports of the first type of cassette are moved in a vertical direction along a support movement path, and further wherein the second emitter has a second energy path at least partially offset from the first energy path in a horizontal direction which is adapted to be periodically at least partially blocked by end sides of the object supports of a second type of the cassettes when the object supports of the second type of cassette are moved in the vertical direction along the support movement path.

* * * * *